(12) United States Patent
Chiu

(10) Patent No.: US 6,464,778 B2
(45) Date of Patent: Oct. 15, 2002

(54) TUNGSTEN DEPOSITION PROCESS

(75) Inventor: Wen Pin Chiu, Da Bei Shiang (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 09/761,881

(22) Filed: Jan. 17, 2001

(65) Prior Publication Data

US 2002/0132481 A1 Sep. 19, 2002

(51) Int. Cl.$^7$ .............................................. C30B 25/14
(52) U.S. Cl. ...................... 117/89; 117/93; 117/102; 117/105; 117/937
(58) Field of Search .................... 117/89, 93, 102, 117/105, 937

(56) References Cited

U.S. PATENT DOCUMENTS

| | | |
|---|---|---|
| 5,028,565 A | 7/1991 | Chang |
| 6,036,366 A | 3/2000 | Andreusson |
| 6,211,082 B1 * | 4/2001 | Yoo et al. ............... 438/680 |
| 6,218,301 B1 * | 4/2001 | Yoon et al. ............... 438/685 |

OTHER PUBLICATIONS

Maeda et al, "Chemical vapor deposited tungsten interconnect technology", Proc. Int. Conf. Solid state integr Circuit technol. 4$^{th}$ 1995 abstract only.*

Yeh et al., "Deposition properties of selective tungsten chemical vapro deposition", Materials Chemistry and Physics vol. 45 No. 3 pp. 284–287 abstract only ,Sep. 1996.*

* cited by examiner

Primary Examiner—Robert Kunemund
(74) Attorney, Agent, or Firm—J.C. Patents

(57) ABSTRACT

A tungsten deposition process. A crystal growth step is carried out in a reaction chamber to form a tungsten crystal layer over a substrate using tungsten hexafluoride, silane and nitrogen as reactive gases. An intermediate step is conducted such that the supply of tungsten hexafluoride to the reaction chamber is cut but the supply of silane is continued. Furthermore, nitrogen is passed into the reaction chamber selectively. A main deposition step is finally conducted to form a tungsten layer over the tungsten crystal layer using tungsten hexafluoride, hydrogen and nitrogen as reactive gases.

20 Claims, 3 Drawing Sheets

TUNGSTEN DEPOSITION PROCESS

BACKGROUND OF THE INVENTION

1. Field of Invention

The present invention relates to a semiconductor deposition process. More particularly, the present invention relates to a tungsten deposition process.

2. Description of Related Art

In semiconductor fabrication, metal is often used to lower electrical resistance of semiconductor devices or conductive lines. One of the most commonly used metals is tungsten. Some tungsten exists as tungsten silicide material inside a semiconductor product while other tungsten exists as pure tungsten material inside semiconductor structure such as a tungsten plug. In general, tungsten is deposited in a low-pressure chemical vapor deposition (LPCVD). The deposition process can be further sub-divided into three different stages including a crystal growth stage, an intermediate stage and a main deposition stage. In the growth stage, tungsten hexafluoride ($WF_6$) and silane ($SiH_4$) are used as reactive gases. The rate of growth of the tungsten layer is rather low. In the main deposition stage, tungsten hexafluoride ($WF_6$) and hydrogen ($H_2$) are used as the reactive gases to deposit tungsten at a higher deposition rate over the slow-growth crystalline layer. Hence, a thicker layer of tungsten is formed. Conventionally, tungsten deposition process also includes an intermediate stage for supplying or terminating the supply of some gases and adjusting gas pressures. In this stage, the supply of reactive gases such as tungsten hexafluoride ($WF_6$) and silane ($SiH_4$) are cut off.

To improve the quality of tungsten deposition, a supply of nitrogen has been proposed in U.S. Pat. No. 5,028,565 so that reflectivity of the deposited tungsten layer is higher. In other words, a smoother tungsten surface is obtained. However, since no tungsten hexafluoride ($WF_6$) and silane ($SiH_4$) are passed during the intermediate stage, the nitrogen molecules ($N_2$) passed into the reaction chamber may occupy the attachment points on the crystalline growth surface of the tungsten layer. In the subsequent main deposition, tungsten deposition reaction will occur only after the nitrogen molecules on the crystalline growth surface has been replaced by reactive gases. Consequently, tungsten deposition rate will be lowered because of this delay reaction or incubation period. In addition, the nitrogen molecules are most likely to leave the tungsten growth surface at different times. Therefore, the resultant tungsten layer may have non-uniform thickness.

Furthermore, by shutting off the supply of nitrogen in the intermediate stage, non-uniformity of the deposited tungsten layer in a silicon wafer and between different silicon wafers will also improve as proposed in U.S. Pat. No. 6,036,366.

SUMMARY OF THE INVENTION

Accordingly, one object of the present invention is to provide a tungsten deposition process having a higher depositing rate and capable of producing a tungsten layer with a uniform thickness. First, a crystal growth step is conducted inside a reaction chamber to form a tungsten crystal layer using tungsten hexafluoride, silane and nitrogen as reactive gases. An intermediate step is conducted by cutting off the supply of tungsten hexafluoride to the reaction chamber but continuing the supply of silane. Meanwhile, nitrogen is selectively supplied. Finally, a main deposition step is conducted inside the reaction chamber to form a tungsten layer over the tungsten crystal layer using tungsten hexafluoride, silane and nitrogen as reactive gases.

This invention also provides an alternative tungsten deposition process having a higher depositing rate and capable of producing a tungsten layer with a uniform thickness. First, a crystal growth step is conducted inside a reaction chamber to form a tungsten crystal layer using tungsten hexafluoride, silane and nitrogen as reactive gases. The supply of tungsten hexafluoride to the reaction chamber is cut off first while the supply of silane is cut off after a defined period, thereby ending the crystal growth step. Within the defined period, gaseous nitrogen is passed into the reaction chamber selectively. In addition, the defined period must be long enough to permit silane molecules to occupy all the attachment points on the crystal growth surface of the tungsten layer. An intermediate step is conducted without passing any tungsten hexafluoride and silane into the reaction chamber. Finally, a main deposition step is conducted inside the reaction chamber to form a tungsten layer over the tungsten crystal layer using tungsten hexafluoride, silane and nitrogen as reactive gases.

According to experiments, the silane passed into the reaction chamber in the intermediate step is capable of occupying all the attachment points on the tungsten crystal layer even in the presence of nitrogen. Reaction between tungsten hexafluoride and silane molecules on the tungsten crystal layer can start immediately in the main deposition step because all nitrogen molecules have already been displaced by silane. By eliminating the incubation period necessary for removing nitrogen, a higher deposition rate of tungsten and a uniform tungsten layer is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
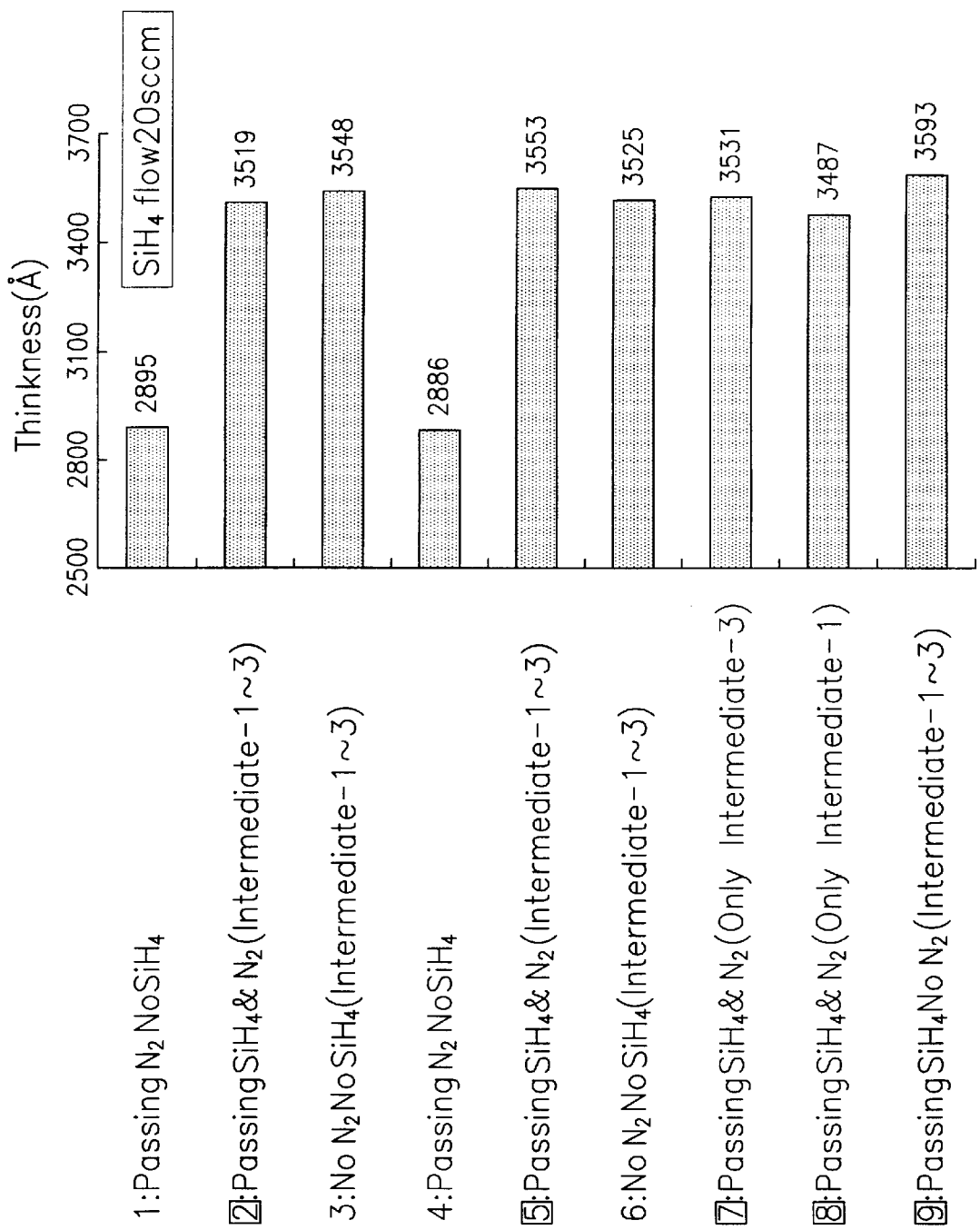
FIG. 1 is a bar chart showing resultant thickness in a tungsten deposition process according to a first example of a first embodiment of this invention that uses a 20 sccm flow rate for silane in the intermediate step (resultant thickness produced by a conventional tungsten deposition process is also shown as a reference)

Reference will now be made in detail to the present preferred embodiments of the invention, examples of which are illustrated in the accompanying drawings. Wherever possible, the same reference numbers are used in the drawings and the description to refer to the same or like parts.

In the first embodiment of this invention, the crystal growth step is divided into a first session growth (shortened to nucleation-1) and a second session growth (shortened to nucleation-2). The flow rate of tungsten hexafluoride ($WF_6$) and tungsten deposition rate in the first session is lower than in the second session so that a higher-quality tungsten crystal layer is obtained. The intermediate step can be further sub-divided into a purging step (shortened to intermediate-1), a pressurizing step (shortened to intermediate-2) and backside inspection step (shortened to intermediate-3). In the purging step, argon (Ar) and hydrogen ($H_2$) (or selectively passing nitrogen ($N_2$)) is passed into a reaction chamber to expel tungsten hexafluoride ($WF_6$). In the pressurizing step, pressure within the reaction chamber is increased to a pressure necessary for performing a main deposition. In the backside inspection step, pressure at the backside of a silicon wafer is checked. In addition, nitrogen ($N_2$) is passed into the reaction chamber in both the crystal growth and main deposition step. On the other hand, the supply of nitrogen into the reaction chamber may be selectively cut in the intermediate step.

A first example of the first embodiment of this invention is given below. Various processing conditions and results are listed in Table 1 and Table 2, wherein:

(1) Aside from nitrogen, the reactive gas also includes argon. Moreover, hydrogen is also passed into the reaction chamber during crystal growth. In addition, there is another inlet for argon and hydrogen near the edge of a silicon wafer. That is, edge-Ar and edge-$H_2$ in Table 1.

(2) The common processing conditions used by the conventional method and this embodiment (the intermediate step, no silane ($SiH_4$) is passed but nitrogen ($N_2$) is passed) are listed out in Table 1.

(3) Particular processing conditions (nitrogen and silane have/have not) and results are listed out in Table 2, wherein the passing of silane in the intermediate step is included in the experiment of this invention. Moreover, 'wafer positions' are labeled with a frame in Table 2.

(4) To prove the suitability of the invention, some processing conditions are experimented with twice and the two inspected silicon wafers are placed in two different slots on the wafer boat (that is, 'wafer positions' labeled in Table 2). In addition, the number of times the deposition reaction chamber has been used before processing the two wafers is also different. The number of times a reaction chamber is used is the number of reactions performed since the last cleanup. This value plus one is the 'wafer count' shown in Table 2.

In addition, thickness of various tungsten layers listed out in Table 2 is also displayed in a horizontal bar chart shown in FIG. 1 for easy comparison. In fact, FIG. 1 is a bar chart showing resultant thickness in a tungsten deposition process according to a first example in a first embodiment of this invention, using a 20 sccm flow rate for silane in the intermediate step.

TABLE 1

| Steps | Nucleation-1 | Nucleation-2 | Intermediate-1 purge | Intermediate-2 pressurize | Intermediate-3 backside inspection | Main deposition |
|---|---|---|---|---|---|---|
| Time(s) | 5 | 15 | 8 | 8 | 6 | 50 |
| Pressure (Torr) | 30 | 30 | 30 | 90 | 90 | 90 |
| Ar(sccm) | 2000 | 2000 | 2700 | 1500 | 1000 | 1000 |
| $N_2$(sccm) | 300 | 300 | Yes/No | Yes/No | Yes/No | 300 |
| $WF_6$-L (sccm) | 5 | 30 | — | — | — | — |
| $WF_6$-H (sccm) | — | — | — | — | — | 120 |
| $SiH_4$ (sccm) | 30 | 10 | Yes/No | Yes/No | Yes/No | — |
| $H_2$(sccm) | 500 | 500 | 1000 | 700 | 700 | 700 |
| Edge-Ar (sccm) | 800 | 800 | 2800 | 2500 | 2500 | 2700 |
| Edge-$H_2$ (sccm) | — | — | — | 800 | 800 | 800 |

TABLE 2

| Wafer Position | $SiH_4$(sccm) | $N_2$(sccm) | Thickness (Å) | Sheet Resistance (m-ohm/sq)/% change | Wafer Count | Reflectivity |
|---|---|---|---|---|---|---|
| 1 | — | 300 | 2895 | 411.9/1.33% | 9 | 84% |
| [2] | 20 (between intermediate-1~3) | 300 | 3519 | 321.9/0.819% | 10 | 78% |
| 3 | — | — | 3548 | 315.8/0.946% | 11 | 78.5% |
| 4 | — | 300 | 2886 | 410.1/1.41% | 12 | 82% |
| [5] | 20 (between intermediate-1~3) | 300 | 3553 | 320.3/0.542% | 13 | 77% |

TABLE 2-continued

| Wafer Position | SiH$_4$(sccm) | N$_2$(sccm) | Thickness (Å) | Sheet Resistance (m-ohm/sq)/% change | Wafer Count | Reflectivity |
|---|---|---|---|---|---|---|
| 6 | — | — | 3525 | 314.2/0.954% | 14 | 76% |
| [7] | 20 (only in intermediate-3) | 300 | 3531 | 325.3/0.985% | 15 | 77% |
| [8] | 20 (only in intermediate-1) | 300 | 3487 | 322.5/0.812% | 16 | 76% |
| [9] | 20 (between intermediate-1~3) | — | 3593 | 316.7/0.951% | 17 | 78% |

An analysis of the experimental results shows:

(a) As shown in FIG. 1, thickness of the tungsten layer is much larger than the tungsten layer obtained by the first conventional method (in positions 1 and 4, N$_2$ is passed in the intermediate step but without any SiH$_4$).

(b) As shown in Table 2, the tungsten layer has a sheet resistance much smaller than the sheet resistance of the tungsten layer obtained by the first conventional method. Since sheet resistance of a tungsten layer relates to thickness of the layer (inversely proportional), sheet resistance is lower as thickness of the tungsten layer is increased. Compared with sheet resistance variation of the tungsten layer formed by the first conventional method (positions 1 and 4, nitrogen is passed in intermediate step, but no silane is passed), the tungsten layer has a high degree of thickness uniformity. Moreover, compared with the sheet resistance variation of the tungsten layer formed by the second conventional method, thickness uniformity of the tungsten layer is, on average, better than the tungsten layer formed by the second conventional method (positions 3 and 6, nitrogen is passed in intermediate step, but no silane is passed).

Figure 2:
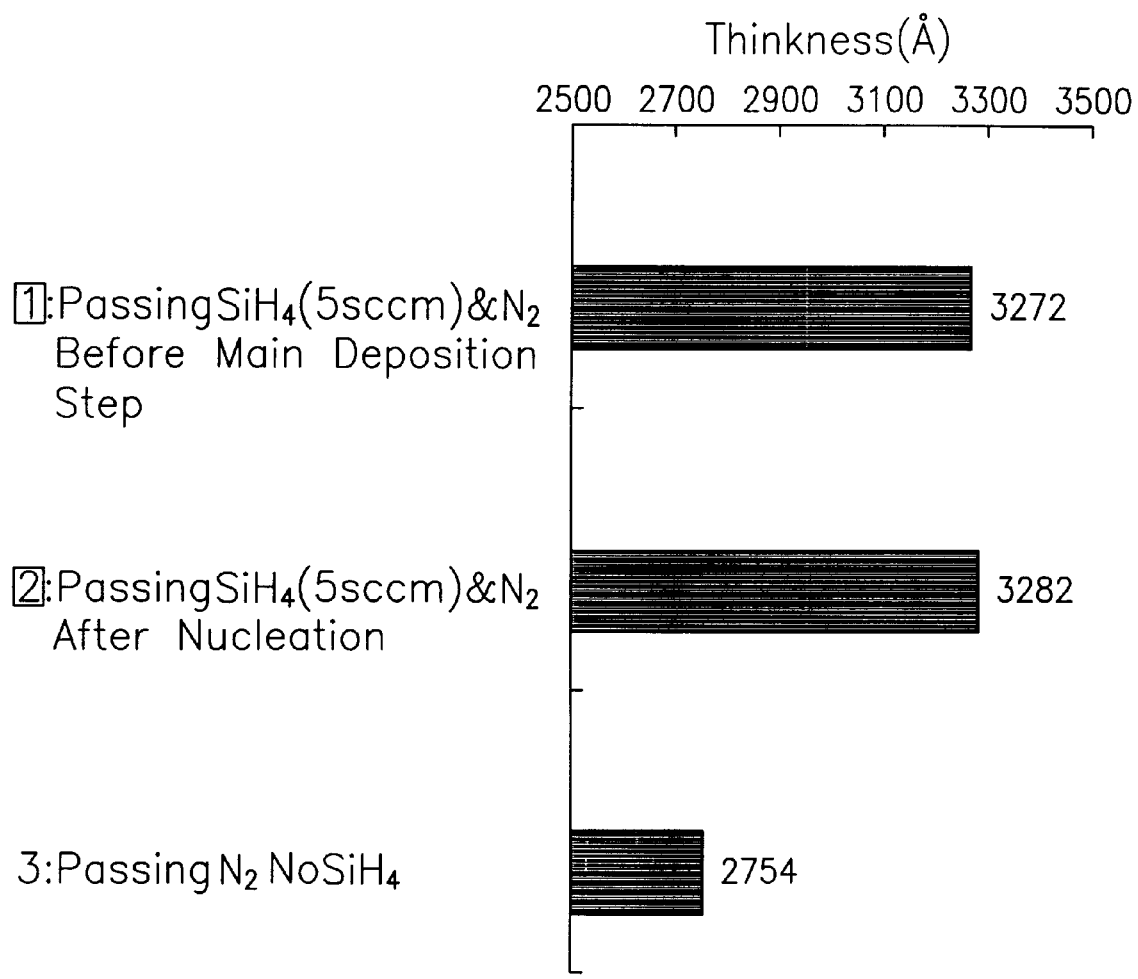
FIG. 2 is a bar chart showing resultant thickness in a tungsten deposition process according to a second example of the first embodiment of this invention that uses a 5 sccm flow rate for silane in the intermediate step (resultant thickness produced by a conventional tungsten deposition process is also shown as a reference)

(c) As shown in FIG. 2, it does not matter if nitrogen is passed in the intermediate step or silane is passed continuously during the intermediate step. The method of this invention is valid as long as silane is passed for a definite period within the intermediate step.

A second example of the first embodiment of this invention is given below. Various processing conditions and results are listed in Table 3 and Table 4, wherein silane (SiH$_4$) is passed into the reaction chamber only while performing the purging step or the backside inspection step. In other words, silane is passed only a definite period after the crystal growth step or before the main deposition step. Furthermore, the silane has a flow rate of 5 sccm instead of 20 sccm in the previous example. In addition, nitrogen (N$_2$) is passed continuously into the reaction chamber. Other conditions are identical to the ones used in the first example.

Finally, thickness of various tungsten layers listed out in Table 4 is also displayed in a horizontal bar chart shown in FIG. 2 for easy comparison. In fact, FIG. 2 is a bar chart showing resultant thickness in a tungsten deposition process according to a second example in the first embodiment of this invention, using a 5 sccm flow rate for silane in the intermediate step.

TABLE 3

| Steps | Nucleation-1 | Nucleation-2 | Intermediate-1 purge | Intermediate-2 pressurize | Intermediate-3 backside inspection | Main deposition |
|---|---|---|---|---|---|---|
| Time(s) | 5 | 15 | 8 | 8 | 6 | 50 |
| Pressure (Torr) | 30 | 30 | 30 | 90 | 90 | 90 |
| Ar(sccm) | 2000 | 2000 | 2700 | 1500 | 1000 | 1000 |
| N$_2$(sccm) | 300 | 300 | 300 | 300 | 300 | 300 |
| WF$_6$-L (sccm) | 5 | 30 | — | — | — | — |
| WF$_6$-H (sccm) | — | — | — | — | — | 120 |
| SiH$_4$ (sccm) | 30 | 10 | Yes/No A4 | — | Yes/No A3 | — |
| H$_2$(sccm) | 500 | 500 | 1000 | 700 | 700 | 700 |
| Edge-Ar (sccm) | 800 | 800 | 2800 | 2500 | 2500 | 2700 |
| Edge-H$_2$ (sccm) | — | — | — | 800 | 800 | 800 |

TABLE 4

| Wafer Position | SiH$_4$ (sccm) | Thickness (Å) | Sheet Resistance (m-ohm/sq) | Wafer Count | Reflectivity |
|---|---|---|---|---|---|
| [1]: only A3 | 5 | 3272 | 331.3 | 6 | 81% |
| [2]: only A4 | 5 | 3282 | 324.6 | 7 | 80% |

TABLE 4-continued

| Wafer Position | SiH₄ (sccm) | Thickness (Å) | Sheet Resistance (m-ohm/sq) | Wafer Count | Reflectivity |
|---|---|---|---|---|---|
| [3]: no A3 and A4 | — | 2754 | 394.5 | 8 | 84% |

As shown in FIG. 2, thickness of the tungsten layer is considerably greater than the one produced by the conventional method. Moreover, according to Tables 1~4, the timing of the passage of silane into the reaction chamber for wafer positions 7 and 8 in the first example of the first embodiment is identical to the timing of the passage of silane for wafer positions 1 and in the second example. The only difference is that a lower flow rate for silane (5 sccm instead of 20 sccm) is used in wafer positions 1 and 2 and hence thickness of the ultimately formed tungsten layer is much smaller (about 100 Å). Moreover, it does not matter if silane is passed in the front session of the intermediate step (the purging step) or in the back session of the intermediate step (the backside inspection step). The method of this invention is valid as long as silane is passed for a definite period within the intermediate step.

A second embodiment of this invention for forming a tungsten layer is also provided. Various processing conditions and results are listed in Table 5 and Table 6. In the second embodiment, no silane (SiH₄) is passed during the intermediate step. Before initializing the intermediate step but after the crystal growth step, the supply of tungsten hexafluoride (WF₆) to the reaction chamber is shut down for 2 seconds before the supply of silane (SiH₄) is cut (B2 item selection). This procedure serves to produce an effect similar to passing silane in the intermediate step. Furthermore, during this 2 seconds period, nitrogen (N₂) is selectively passed into the reaction chamber. In addition, the processing conditions/result of the following four modes—A1, A2, B1 and A1~B2 both none—are listed out for comparison. Mode A1 refers to a mode of operation that includes stopping the silane supply for 2 seconds before cutting the supply of tungsten hexafluoride. Mode A1 refers to a mode of operation that includes passing silane and tungsten hexafluoride for 2 seconds without passing any nitrogen. Mode B1 refers to a mode of operation that includes shutting down the supply of silane and tungsten hexafluoride at the same time but continues passing nitrogen for 2 more seconds. A1~B2 both none mode refers to a mode of operation that includes performing the purging step immediately after a second session crystal growth step.

TABLE 5

| Steps | Nucleation-1 | Nucleation-2 | Yes/No A1 (or A2, B1, B2) | Intermediate-1 purge | Intermediate-2 pressurize | Intermediate-3 backside inspection | Main deposition |
|---|---|---|---|---|---|---|---|
| Time (s) | 5 | 15 | 2 seconds | 8 | 8 | 6 | 50 |
| Pressure (Torr) | 30 | 30 | 30 | 30 | 90 | 90 | 90 |
| Ar (sccm) | 2000 | 2000 | 2000 | 2700 | 1500 | 1000 | 1000 |
| N₂ (sccm) | 300 | 300 | Yes/No | 300 | 300 | 300 | 300 |
| WF₆-L (sccm) | 5 | 30 | Yes/No | — | — | — | — |
| WF₆-H (sccm) | — | — | — | — | — | — | 120 |
| SiH₄ (sccm) | 30 | 10 | Yes/No | Yes/No A4 | — | Yes/No A3 | — |
| H₂ (sccm) | 500 | 500 | 500 | 1000 | 700 | 700 | 700 |
| Edge-Ar (sccm) | 800 | 800 | 800 | 2800 | 2500 | 2500 | 2700 |
| Edge-H₂ (sccm) | — | — | — | — | 800 | 800 | 800 |

TABLE 6

| Wafer Position | Time (s) | WF6-L (sccm) | SiH4 (sccm) | N2 (sccm) | Thickness (Å) | Sheet Resistance (m-ohm/sq)/% change | Wafer Count | Reflectivity |
|---|---|---|---|---|---|---|---|---|
| 6:A1 | 2 | 30 | — | 300 | 2759 | 385.6/3.56% | 1 | 83% |
| 7:A2 | 2 | 30 | 10 | — | 2795 | 387.4/1.07% | 2 | 83% |
| 8:B1 | 2 | — | — | 300 | 2769 | 396.8/1.00% | 3 | 85% |
| [9]:B2 | 2 | — | 10 | — | 3302 | 324.0/0.93% | 4 | 81% |
| 10:A1~B2 both none | — | — | — | — | 2759 | 397.4/1.44% | 5 | 85% |

Figure 3:
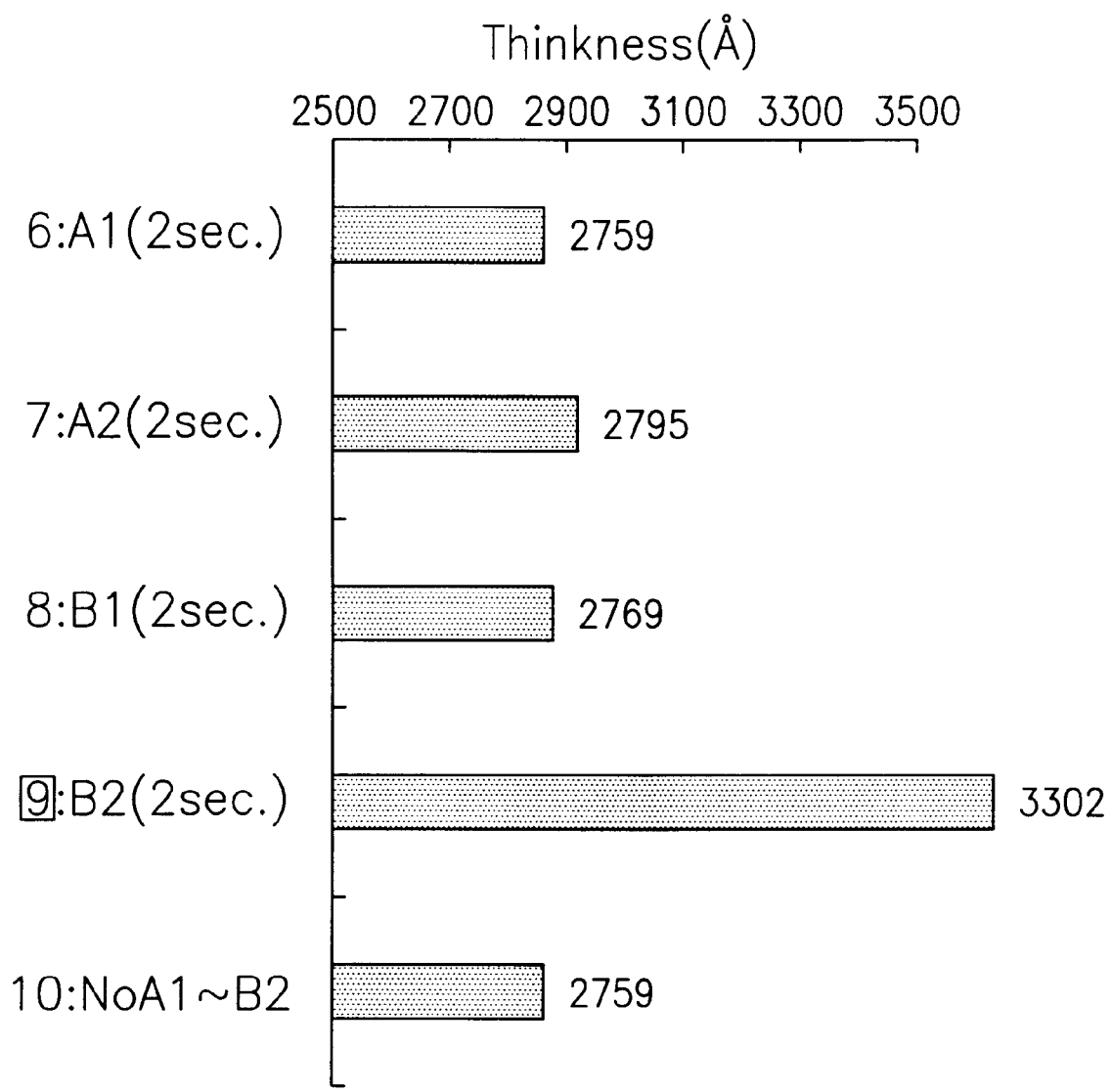
FIG. 3 is a bar chart showing resultant thickness in a tungsten deposition process according to a second embodiment of this invention (resultant thickness produced by a conventional tungsten process is also shown).

According to the series of experiments, an analysis of the results is described as follows:

(a) As shown in Table 6 and FIG. 3, the shutting of silane supply for the selected item B2 occurs quite late. Therefore, silane (SiH₄) is able to occupy the attachment points on the crystal growth surface of the tungsten crystal layer and prevent the attachment of nitrogen (N₂) to the tungsten crystal layer. Hence, both deposition rate of tungsten and thickness of the ultimately formed tungsten layer are increased. In addition, percentage variation of the sheet resistance of the tungsten layer in this embodiment is the lowest. This indicates the tungsten layer has the best thickness uniformity.

(b) On the contrary, in cases A1 and B1, no silane is passed into the reaction chamber. Since nitrogen passing into the reaction chamber during the mid-intermediate step and late-intermediate step can occupy the attachment points on the tungsten crystal layer, rate of deposition and hence thickness of the tungsten layer is reduced. A comparison of sheet resistance variation shows a larger change than the selected item B2, indicating a lower degree of thickness uniformity.

(c) As for A2, since $WF_6$ and $SiH_4$ are passed into the reaction chamber simultaneously, more silane is consumed. Thus, the attachment points on the tungsten crystal layer will be occupied by nitrogen leading to a thinner tungsten layer similar in thickness to A1 and B1.

(d) According to Table 5 and the results shown in selected item B2 of Table 6, the ultimate result is unaffected by the continuous passing of nitrogen, even for more than 22 seconds after the initial passing of silane for 2 seconds. This is because there is no way for the nitrogen to replace the silane on the tungsten crystal layer.

In conclusion, silane can be used throughout the intermediate step as described in the first example of the first embodiment. Silane can also be used only in the front session and the back session of the intermediate step as described in the second example of the first embodiment. Furthermore, silane can be used only within a definite period after the end of crystal growth step as described in the second embodiment of this invention. In other words, the advantage of the invention is realized as long as silane is passed some time between crystal growth step and the main deposition step. This is because there is no way for the subsequently passed nitrogen to replace the silane already adhered to the tungsten crystal layer.

Proof can be found in selected item B2 of Table 6 in the second embodiment of this invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A tungsten deposition process for depositing tungsten over a substrate inside a reaction chamber, comprising the steps of:

performing a crystal growth by passing a first reactive gas into the reaction chamber to form a tungsten crystal layer over the substrate, wherein the first reactive gas at least contains tungsten hexafluoride ($WF_6$), silane ($SiH_4$) and nitrogen ($N_2$);

performing an intermediate step by passing at least silane ($SiH_4$) into the reaction chamber but without passing any tungsten hexafluoride ($WF_6$) into the reaction chamber; and performing a main deposition by passing a second reactive gas into the reaction chamber to form a tungsten layer over the tungsten crystal layer, wherein the second reactive gas contains tungsten hexafluoride ($WF_6$), hydrogen ($H_2$) and nitrogen ($N_2$).

2. The process of claim 1, wherein silane ($SiH_4$) is continuously passed into the reaction chamber throughout the intermediate step.

3. The process of claim 1, wherein silane ($SiH_4$) is passed into the reaction chamber for a period long enough for silane to occupy all attachment points on the tungsten crystal layer.

4. The process of claim 3, wherein the period for passing silane ($SiH_4$) into the reaction chamber is placed after the crystal growth step and at the start of a purging inside the intermediate step.

5. The process of claim 3, wherein the period for passing silane ($SiH_4$) into the reaction chamber is placed before the main deposition step at the end of the purging inside the intermediate step.

6. The process of claim 3, wherein the intermediate step can be further subdivided into a purging step, a pressurizing step and a backside pressure inspection step so that silane ($SiH_4$) is passed only within the purging step.

7. The process of claim 3, wherein the intermediate step can be further subdivided into a purging step, a pressurizing step and a backside pressure inspection step so that silane ($SiH_4$) is passed only within the backside pressure inspection step.

8. The process of claim 1, wherein the flow rate of silane ($SH_4$) passing into the reaction chamber during the intermediate step is between 5 sccm to 20 sccm.

9. The process of claim 1, wherein the first reactive gas further includes hydrogen ($H_2$).

10. The process of claim 1, wherein the gas used in the intermediate step includes nitrogen ($N_2$).

11. The process of claim 1, wherein crystal growth step further includes a first session crystal growth and a second session crystal growth such that the flow rate of tungsten hexafluoride ($WF_6$) in the first session is smaller than the flow rate of tungsten hexafluoride ($WF_6$) in the second session.

12. The process of claim 1, wherein the gas for performing the crystal growth step, the intermediate step and the main deposition step contains argon (Ar).

13. A tungsten deposition process for forming a tungsten layer over a substrate inside a reaction chamber, comprising the steps of:

performing a crystal growth by passing a first reactive gas into the reaction chamber to form a tungsten crystal layer over the substrate, wherein the first reactive gas at least includes tungsten hexafluoride ($WF_6$), silane ($SiH_4$) and nitrogen ($N_2$);

shutting down the supply of tungsten hexafluoride ($WF_6$) to the reaction chamber for a period before shutting down the supply of silane ($SiH_4$) to the reaction chamber, wherein the period is long enough for the silane ($SiH_4$) to occupy all attachment points on the tungsten crystal layer;

performing an intermediate step by passing at least silane ($SiH_4$) into the reaction chamber but without passing any tungsten hexafluoride ($WF_6$) into the reaction chamber; and performing a main deposition by passing a second reactive gas into the reaction chamber to form a tungsten layer over the tungsten crystal layer, wherein the second reactive gas contains tungsten hexafluoride ($WF_6$), hydrogen ($H_2$) and nitrogen ($N_2$).

14. The process of claim 13, wherein no nitrogen ($N_2$) is passed into the reaction chamber during the period between the shutting down of tungsten hexafluoride ($WF_6$) supply and the shutting down of silane ($SiH_4$) supply.

15. The process of claim 13, wherein nitrogen ($N_2$) is passed into the reaction chamber throughout the intermediate step.

16. The process of claim 13, wherein the flow rate of silane ($SiH_4$) during the period between the shutting down of tungsten hexafluoride ($WF_6$) supply and the shutting down of silane ($SiH_4$) supply is about 2000 sccm.

17. The process of claim 13, wherein the period between the shutting down of tungsten hexafluoride ($WF_6$) supply and the shutting down of silane ($SiH_4$) supply lasts for about 2 seconds.

18. The process of claim 13, wherein crystal growth step further includes a first session crystal growth and a second session crystal growth such that the flow rate of tungsten hexafluoride ($WF_6$) in the first session is smaller than the flow rate of tungsten hexafluoride ($WF_6$) in the second session.

19. The process of claim 13, wherein the first reactive gas includes hydrogen ($H_2$).

20. The process of claim 13, wherein the gas for performing the crystal growth step, the intermediate step and the main deposition step contains argon (Ar).

* * * * *